United States Patent [19]
Feldman et al.

[11] Patent Number: 5,978,393
[45] Date of Patent: Nov. 2, 1999

[54] LASER DIODE POWER OUTPUT CONTROLLER AND METHOD THEREOF

[75] Inventors: Michael R. Feldman, Charlotte; John Childers, Concord; Fouad Kiamilev, Charlotte, all of N.C.

[73] Assignee: Digital Optics Corporation, Charlotte, N.C.

[21] Appl. No.: 08/917,106

[22] Filed: Aug. 25, 1997

[51] Int. Cl.[6] ...................................................... H01S 3/10

[52] U.S. Cl. .............................................. 372/31; 372/38

[58] Field of Search ................................. 372/31, 38, 29, 372/33, 26

[56] References Cited

U.S. PATENT DOCUMENTS

| | | | |
|---|---|---|---|
| 4,995,105 | 2/1991 | Wechsler | 372/38 |
| 5,170,403 | 12/1992 | Mayer | 372/26 |
| 5,216,682 | 6/1993 | Hedberg | 372/31 |
| 5,255,276 | 10/1993 | Tabuchi et al. | 372/32 |
| 5,297,157 | 3/1994 | Kaiser et al. | 372/38 |
| 5,313,482 | 5/1994 | Zelenka et al. | 372/38 |
| 5,317,578 | 5/1994 | Ogou | 372/31 |
| 5,383,208 | 1/1995 | Queniat et al. | 372/29 |
| 5,397,933 | 3/1995 | Yamada | 327/109 |
| 5,467,363 | 11/1995 | Okabayashi | 372/31 |
| 5,579,328 | 11/1996 | Habel et al. | 372/31 |
| 5,589,786 | 12/1996 | Bella et al. | 327/108 |
| 5,604,757 | 2/1997 | Liang et al. | 372/29 |
| 5,832,012 | 11/1998 | Araki et al. | 372/31 |

OTHER PUBLICATIONS

Current Sourcing and On–Chip Amplifers Sharpen Laser Diode Driver's Design Edge (AD0660), IC features 200 MHz ouput switching and 1.5 ns rise time, Norwood, Mass (Dec. 7, 1995.

IBM Technical Disclosure Bulletin, vol. 37 No. 02A, Feb. 1994, Temperature and Aging Compensation of Laser Drive Circuits, IBM Corp 1994, pp. 279–280.

A Laser Control Chip Combing a Power Regulator and a 622–MBit/s Modulator, Christian Olgaard, Student Member, IEEE, IEEE log No. 9402151, Journal of Solid–State Circuits vol. 29 No. 8, Aug. 1994 pp. 947–951.

*Primary Examiner*—James W. Davie
*Attorney, Agent, or Firm*—Jones Volentine, L.L.P.

[57] ABSTRACT

A laser diode power controller, and method, are disclosed. The controller can be implemented entirely in CMOS technology due to the simplicity of its quasi-decision-based control routines. The control routines involve the use of a window comparator which determines whether the measured power level of a laser diode falls within a desired range of values. The simplified control routines are also manifested by the use of digital registers to set the desired current values that are to be output to the laser diode and monitor diode. The modulation current supplied to the laser diode exhibits much lower noise levels because the modulation digital to analog converter (DAC) By supplying a continuous current that is selectively switched between the laser diode and a dummy load, much less noise is induced in the power supply than if it had to respond to large changes in modulation current, i.e., OFF (zero) and ON (desired Imod).

33 Claims, 10 Drawing Sheets

| Input | Output (Z) |
|---|---|
| + > − | 1 |
| + < − | 0 |

| Input | Output ($Z_1$, $Z_2$) |
|---|---|
| $P_L < P_{AV} < P_H$ | 00 |
| $P_{AV} < P_L < P_H$ | 01 |
| $P_L < P_H < P_{AV}$ | 10 |

LASER DIODE POWER OUTPUT CONTROLLER AND METHOD THEREOF

FILED OF THE INVENTION

The invention relates to a device and method for controlling the output power of laser diodes. More particularly, the invention relates to a device and method for digitally controlling the output power of laser diodes, e.g., for implementation into optical disk drive technology.

BACKGROUND OF THE INVENTION

Laser diodes are widely used in the field of optical disk drive technology, and also in the field of digital transmission over optical fibers. Such laser diodes have the drawback of showing large variations in their luminous output power due to temperature changes in, and aging of, the laser diode.

Figure 1A:
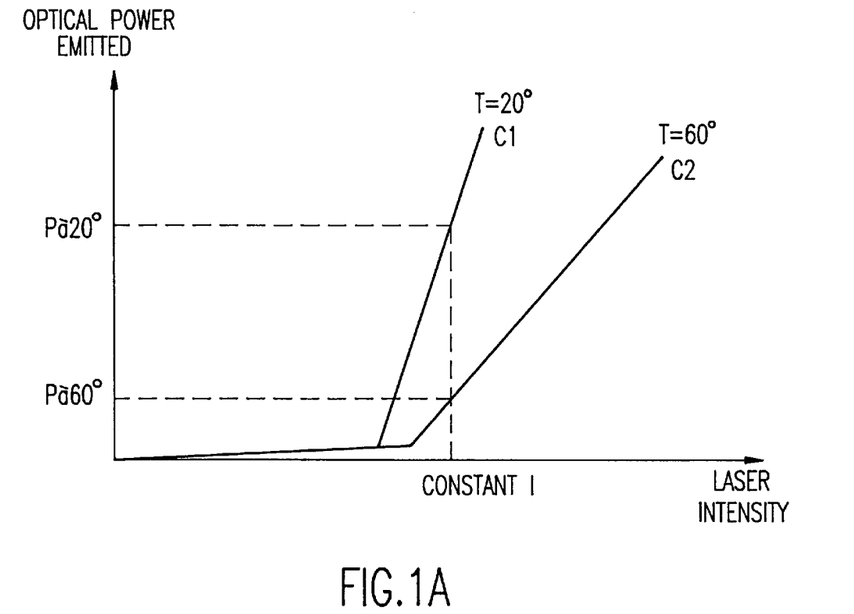
FIGS. 1a and 1b are plots of current versus optical power emitted that depict the effects of temperature and aging upon a laser diode.
Figure 1B:
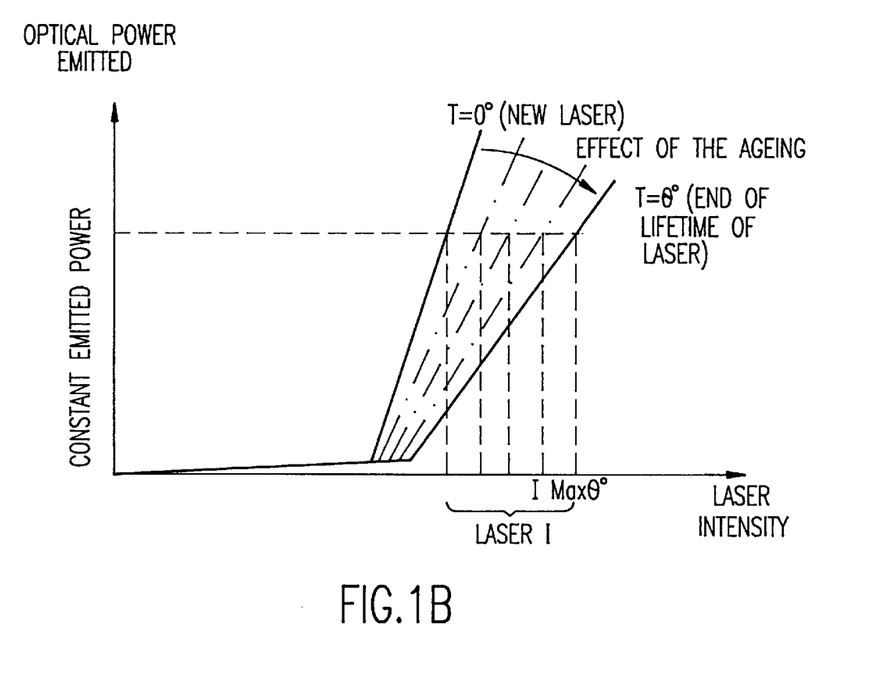

FIGS. 1A and 1B illustrate the effects of temperature and aging upon the output of a laser diode. FIG. 1A depicts the variations of the characteristic curve of a laser diode as a function of the temperature. For a temperature of T=20° C., the curve C1 is obtained and for a temperature of T=60° C., the curve C2 is obtained. It can be observed that, for a constant current I to the laser diode, the optical power emitted when the temperature is equal to 20° C. is greater than the optical power emitted when the temperature is equal to 60° C.

FIG. 1B depicts plural characteristic curves of laser diodes, one of which corresponds to a new laser diode and another to a laser diode at the end of its lifetime. These characteristic curves have been plotted for a constant temperature equal to θ° C. It can be observed in FIG. 1B that the optical power emitted, for a given current I to the laser diode, is weaker when the laser is at the end of its lifetime.

Figure 2:
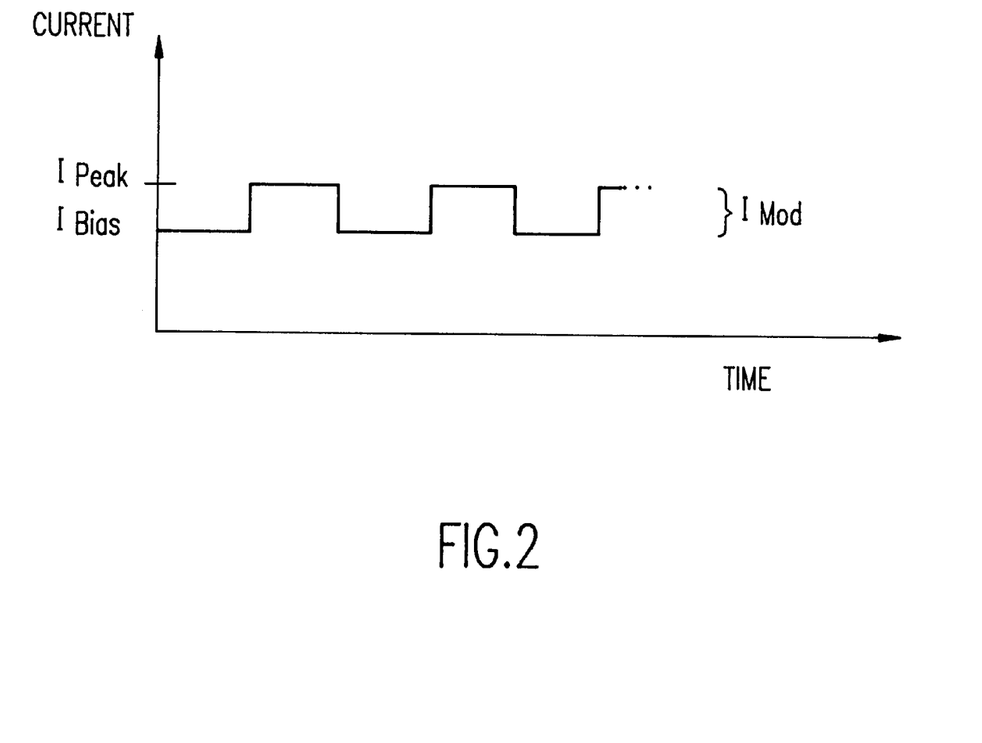
FIG. 2 depicts the typical waveform used to drive a laser diode.

Laser drivers are typically controlled with an analog circuit that has at least two external resistors: one to adjust the bias current and one to adjust the maximum power output. FIG. 2 depicts the typical current wave form provided to a laser diode. The current Ibias is set to approximately the threshold current at which the laser lases. The modulation current Imod is set as the difference between the required peak current Ipeak and the bias current, i.e., Imod=Ipeak−Ibias.

During manufacture of a laser driver, the bias current Ibias is set by providing an external resistor and adjusting it until the laser diode barely lases. In the manufacturing environment, this resistor is trimmed by a laser to adjust it to its final value, which results in a bias current approximately equal to the threshold current. Similarly, to set the peak output power, i.e., the peak current to the laser, another external resistor is provided and adjusted until the peak output power of the laser diode is achieved. This resistor is also trimmed with a laser to its final value.

There are several problems associated with the typical laser driver. It requires external resistors and laser trimming, which consumes space otherwise available for other circuitry and complicates the manufacturing process, respectively. More importantly, the typical laser driver fails to compensate for the effects of temperature and aging, discussed above, upon the laser diode. Consequently, laser diode controllers have been developed which compensate for temperature-induced changes and aging-related changes in the laser diode.

One such method involves carrying out analog regulation of the luminous power by the laser diode. This is done by comparing a signal representing the luminous power (as obtained from a monitor photodiode) against a reference value to obtain an error signal. This error signal is used to modify the current that is supplied to the laser diode. One way to implement this is to set the modulation current Imod equal to a constant value and then adjust the bias current Ibias to keep the detected luminous power equal to a constant value. This requires the use of two external resistors to set the values of Imod and desired luminous power.

Another way to implement this method is to set the bias current Ibias equal to a constant value and then adjust the modulation current Imod to keep the measured luminous power equal to a desired luminous power. Again, this requires the use of two external resistors. A particular way to do this is to control the modulation current Imod to be Imod=k1+k2*Ibias. Trim resistors are used to set the coefficient k1 and the desired luminous output power. The coefficient k2 is set in an internal register. Though the latter technique is the best of the implementations discussed above, it still requires the use of trim resistors.

Another laser diode power controller has implemented a more robust analog linear, i.e., proportional-integral (PI), control algorithm using digital logic, but this has required the measurement of both the maximum output power and minimum output power of the laser diode. Such a controller is implemented on a single integrated circuit using BiCMOS technology. The bipolar transistor technology is used for the current-source portions of the circuitry because it is fast and can supply large amounts of current.

As is known, designers of integrated circuits are under tremendous pressure to continually increase the number of discrete functional device, i.e., groupings of transistors, fabricated on a single chip. As such designers of high current-sourcing circuitry have embraced bipolar technology, and with it BiCMOS technology, because the bipolar technology consumes much much less surface area of a chip than would be consumed by the number of NMOS, PMOS or CMOS transistors need to source a comparable amount of current. The CMOS technology has long ago been discarded for use as high current-sourcing circuitry because it cannot comply with the design demands of higher integration, mentioned above. Moreover, designers have not yet made CMOS circuitry perform at the speeds obtainable with bipolar technology, making it even less desirable to designers of high current-sourcing circuitry.

The BiCMOS technology has the problem of being significantly more expensive than pure CMOS technology because of its bipolar technology aspect.

SUMMARY OF THE INVENTION

It is an object of the invention to overcome the problems of the prior art.

It is an object of the invention to provide a device for controlling a power output of a laser diode for which the high current-sourcing circuitry, used to drive the laser diode, is formed entirely of CMOS transistors. The Inventors have recognized that, for certain applications, driver circuits formed entirely of CMOS transistors can supply sufficient amounts of current with sufficient response times. For these certain applications, the integrated circuitry is of moderate enough complexity to permit the driver transistors to consume approximately 50% of the chip, which defies the high-integration design criteria constraining the thinking in the prior art.

It is an object of the invention to provide a device for controlling a power output of a laser diode that uses relatively simple, quasi-decision-based control rather than the proportion-integral (PI) control of the prior art. This decision-based control is embodied in the form of a digital range detector for determining if the measured power level of the laser diode is within a desired range of values, and is also embodied in the logic which adjusts the current to the laser diode so that the output power returns to the desired range should it exceed that range.

It is the object of the present invention to provide a device and method for controlling a power output of a laser diode which continually supplies the desired modulation current and selectively switches that modulation current between a dummy load and the laser diode so as to reduce the noise otherwise induced in the power supply if it were to respond to large changes in the modulation current.

The objects of the invention are fulfilled by providing a device and the method embodied therein for controlling a power output of a laser diode, the device comprising: a power indicator circuit for providing a first signal indicative of a power level being output by said laser diode; a digital bias current setting circuit for determining a digital representation of a bias current; a digital modulation current setting circuit for determining a digital representation of a modulation current; a digitally-controlled bias current source for providing an analog bias current to said laser diode based upon said digital representation of said bias current; and a digitally-controlled modulation current source for providing an analog modulation current to said laser diode based upon said digital representation of said modulation current; said digital bias current setting circuit, said digital modulation current setting circuit, said digitally-controlled bias current source and said digitally-controlled modulation current source being formed of CMOS transistors.

The objects of the present invention are also fulfilled by providing a device and the method embodied therein for controlling a power output of a laser diode, the device comprising: a power indicator circuit for providing a first signal indicative of a power level being output by said laser diode; a range detector for determining if said power level of said laser diode is within a desired range of values based upon said first signal and for providing a digital second signal indicative thereof; a digital bias current setting circuit for determining a digital representation of a bias current; a digital modulation current setting circuit for determining a digital representation of a modulation current; at least one of said digital representation of said bias current and said digital representation of said modulation current being determined in part according to said digital second signal; a digitally-controlled bias current source for providing an analog bias current to said laser diode based upon said digital representation of said bias current; and a digitally-controlled modulation current source for providing an analog modulation current to said laser diode based upon said digital representation of said modulation current.

The objects of the present invention are also fulfilled by providing a device and the method embodied therein for controlling a power output of a laser diode, the device comprising: a power indicator circuit for providing a first signal indicative of a power level being output by said laser diode; a digital bias current setting circuit for determining a digital representation of a bias current; a digital modulation current setting circuit for determining a digital representation of a modulation current; a digitally-controlled bias current source for providing an analog bias current to said laser diode based upon said digital representation of said bias current; and a digitally-controlled modulation current source for providing an analog modulation current to said laser diode based upon said digital representation of said modulation current; a dummy load; and a switching circuit for selectively switching said analog modulation current to one of said laser diode and said dummy load so that said analog modulation current is continually supplied to one of said laser diode and said dummy load and so that sympathetic noise in other circuitry is reduced.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 3:
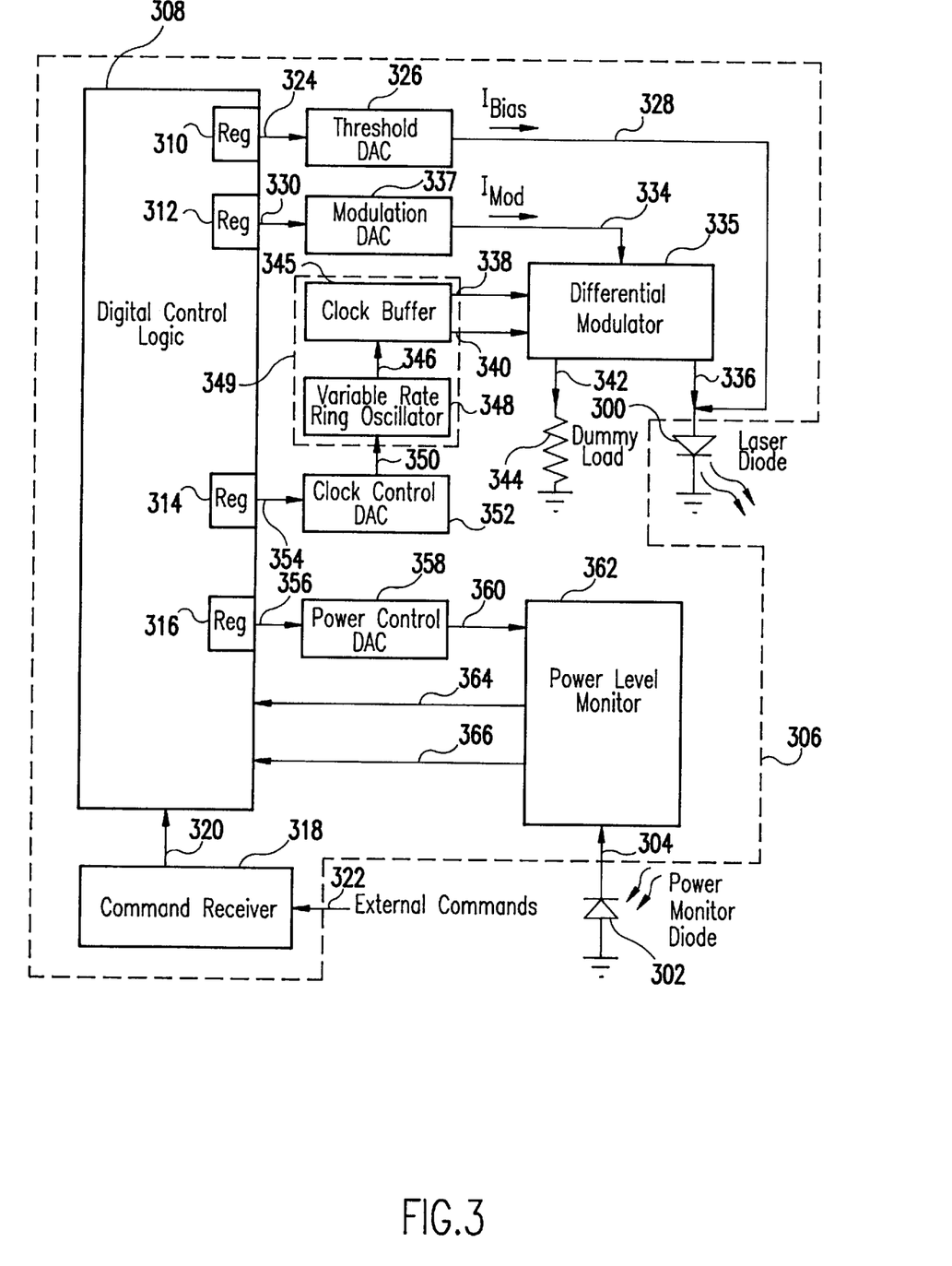
FIG. 3 depicts an embodiment of the present invention.
Figure 9:
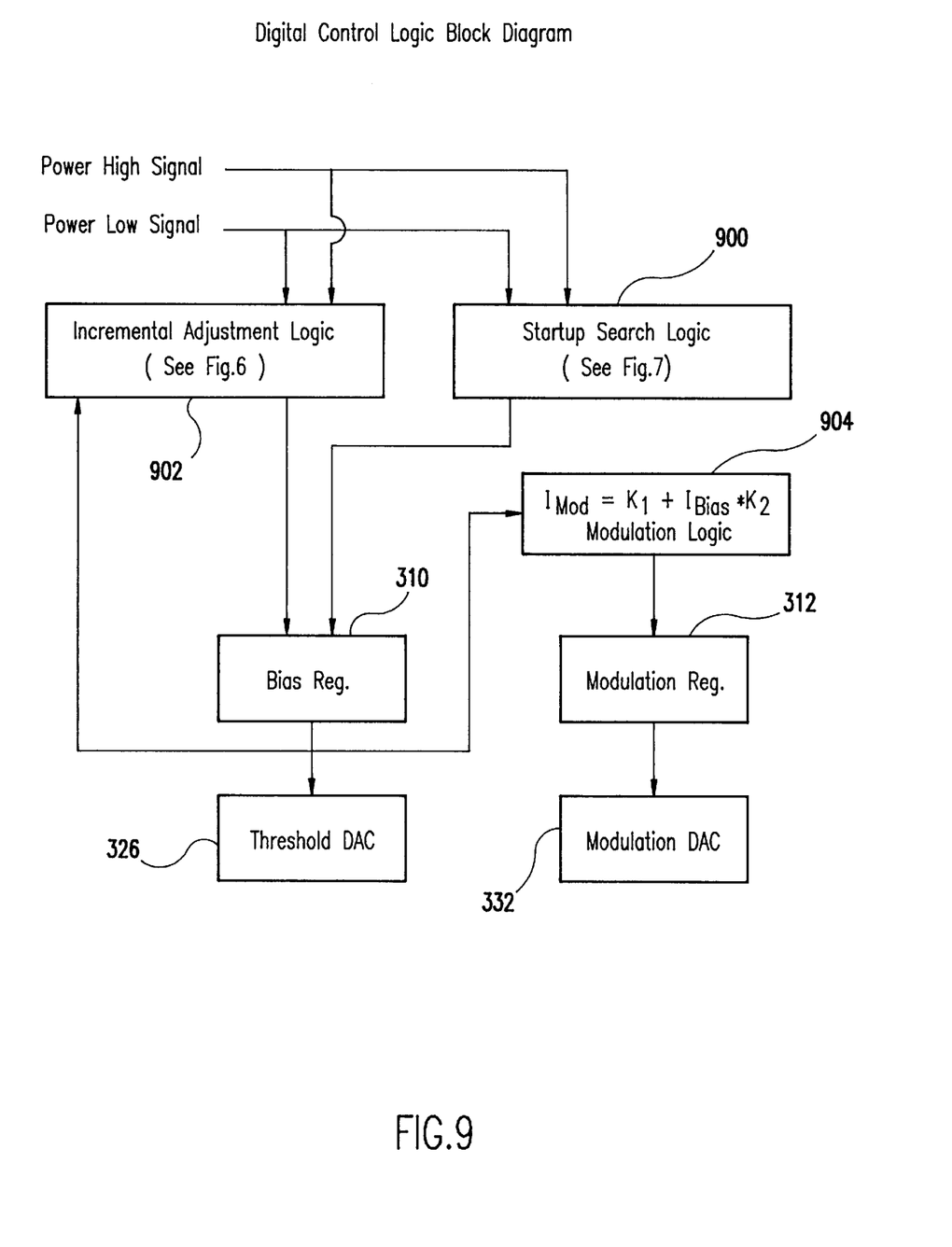
FIG. 9 depicts the functional units in the control logic of the invention.

FIG. 3 depicts an embodiment of the invention. Preferably, all of the transistors of the devices depicted in FIGS. 3 and 9 are formed of CMOS technology, e.g., 0.5 micron CMOS technology. Other CMOS technology, having a different minimum feature size could be used to implement the invention. The choice of which type/minimum-feature-size of CMOS technology to select depends upon the particular application under consideration and necessarily involves a balancing of the competing factors of speed, cost and power consumption.

In FIG. 3, a laser diode 300 (for converting electrical current into optical power) and a power monitor photodiode 302 (for converting optical power into electrical current) are connected to a power controller 306. The photodiode 302 is preferably a large, slowly responding photodiode whose output is not amplified. The output of the photodiode 302 represents the average power output by the laser diode 300.

The power controller 306 of FIG. 3 includes digital control logic 308, a command receiver 318, a threshold digital to analogue converter (DAC) 326, a modulation (DAC) 332, a differential modulator 335, a dummy load 344, a clock buffer 345, a variable rate ring oscillator 348, a clock control DAC 352, a power control DAC 358, and a power level monitor 362. The variable rate ring oscillator 348 and the clock buffer 345 represent a clock generator 349.

The command receiver 318 of FIG. 3 receives external commands via the signal lines 322 and communicates with the digital control logic 308 via the signal lines 320. The digital control logic 308, among other things, includes the registers 310, 312, 314 and 316. These registers are, e.g., 8 bits in size. The bias register 310 is connected to the threshold DAC 326 via the signal line 324. The modulation register 312 is connected to the modulation DAC 332 via the signal line 330. The clock register 314 is connected to the clock control DAC 352 via the signal line 354. The monitor register 316 is connected to the power control DAC 358 via the signal line 356.

The threshold DAC 326 of FIG. 3 is connected to the laser diode 332 via the signal line 328 carrying the bias current Ibias. The laser diode 300 is also connected to the differential modulator 335 via the signal line 336. The modulation DAC 332 is connected to the differential modulator via the signal line 334 carrying the modulation current Imod 335. The clock buffer 345 is connected to the differential modulator 335 via the signal lines 338 and 340. The differential modulator is connected to the dummy load 344 via the signal line 342. The dummy load 344, the laser diode 300 and the power monitor diode 302 are each connected to ground.

An input to the clock buffer 345 of FIG. 3 is connected to an output of the variable rate ring oscillator 348 via the signal line 346. An input of the variable rate ring oscillator 348 is connected to an output of the clock control DAC 352 via the signal line 350.

An input of the power level monitor 362 is connected to the power monitor 302 via the signal line 304 while another input of the power level monitor 362 is connected to the power control DAC 358 via the signal line 360. Two inputs of the digital control logic 308 are connected to two outputs of the power level monitor 362 via the signal lines 364 and 366.

FIG. 9 very generally depicts the functional units included in the digital control logic 308. These include the startup search logic 900 (which implements the routine of FIG. 7, to be discussed below), the bias register 310, the incremental adjustment logic 902 (which implements the routine of FIG. 6, to be discussed below) and the modulation current logic 904 (to be discussed below).

The discrete logic components and/or transistors in the digital control logic 308 have not been depicted, with the exception of the registers 310, 312, 314, and 316. Given the operational description of the digital control logic that follows, it is within the ordinary level of skill in the art to code these operational principles in a language that can be translated automatically into interconnected digital logic components using commercially available translation packages, e.g., the Design Compiler Software sold by the SYNOPSYS company.

Figure 4:
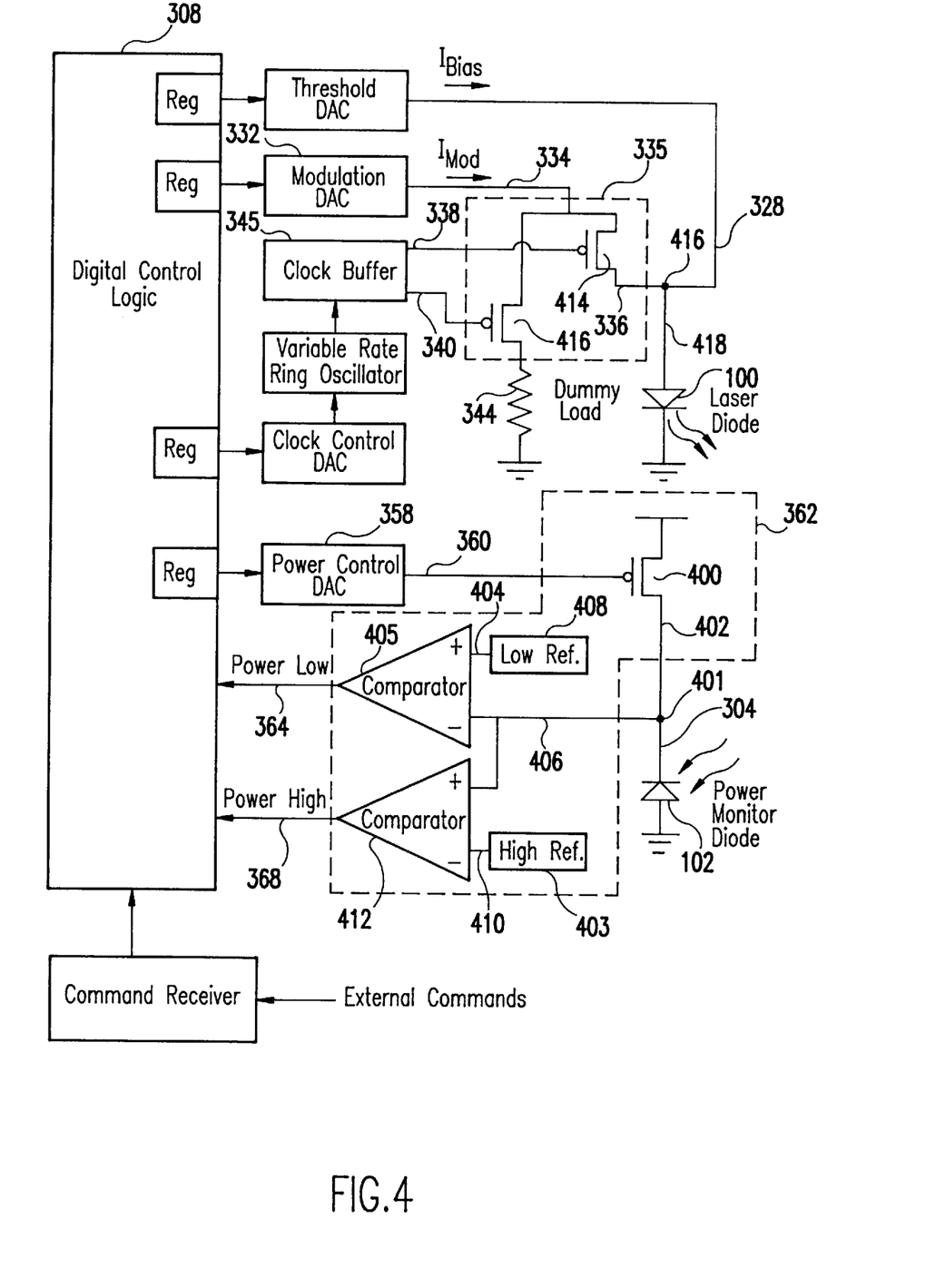
FIG. 4 depicts the embodiment of FIG. 3 in greater detail.

FIG. 4 depicts the embodiment of FIG. 3 in more detail. More particularly, the differential modulator 335 and the power level monitor 362 are depicted in greater detail. The item numbers in FIG. 4 are generally the same as those in FIG. 3. Only the numbers of items directly connected to the differential modulator 335 and the power level monitor 362 have been listed in FIG. 4, for simplicity.

The power level monitor 362 of FIG. 4 includes a PMOS transistor 400, the source of which is connected to Vdd, the gate of which is connected to the power control DAC 358 via the signal line 360, and the drain of which is connected to the power monitor photodiode 102 via the signal line 402 (that is connected to the signal line 304 at the node 401). The power level monitor 362 also includes a first comparator 405 and a second comparator 412.

The plus input of the comparator 405 of FIG. 4 is connected to a low power reference value 408 via the signal line 404. The minus input of the comparator 405 is connected to the node 401 via the signal line 406. The signal line 406 also is connected to the plus input of the comparator 412. The minus input of the comparator 412 is connected to a high power reference value 403 via the signal line 410. The output of the comparator 405 provides a power low digital signal to an input of the digital control logic 308 via the signal line 364 while the output of the comparator 412 provides a power high digital signal to another input of the digital control logic 308 via the signal line 368.

The differential modulator 335 of FIG. 4 includes a first PMOS transistor 414 and a second PMOS transistor 416. The sources of both the PMOS transistors 414 and 416 are each connected to the output of the modulation DAC via the signal line 334. The gate of the PMOS transistor 414 is connected to a first output of the clock buffer 345 via the signal line 338, and the drain of the PMOS transistor 414 is connected to the laser diode 100 via the signal line 336 (that connects to a signal line 418 at the node 416), the signal line 328 also connecting to the node 416. The gate of the PMOS transistor 416 is connected to a second output of the clock buffer 345 via the signal line 340. The drain of the PMOS transistor 416 is connected to the dummy load 344.

Figure 5A:
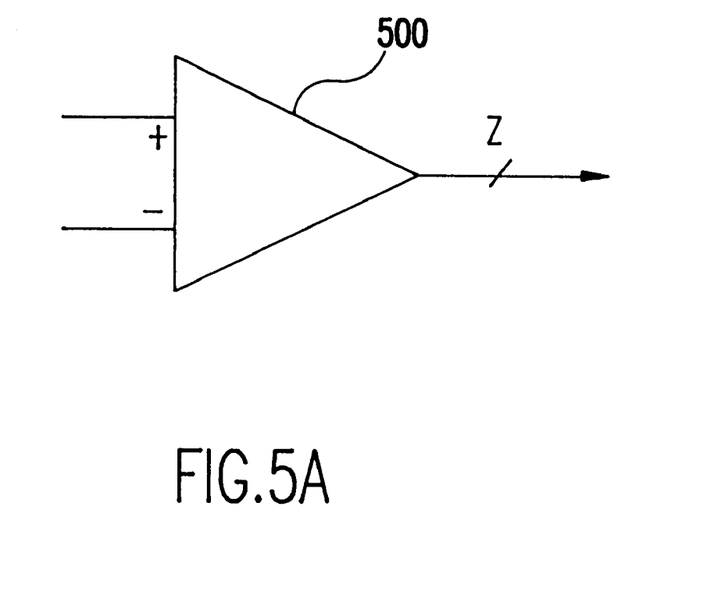
FIGS. 5a and 5b depict a comparator and its operational states.
Figure 5B:
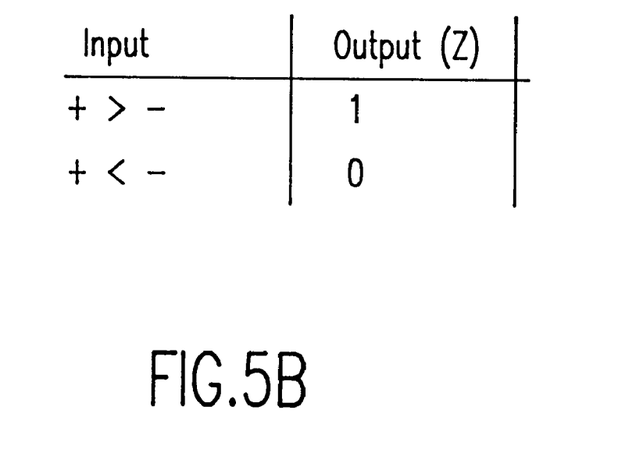
Figure 5C:
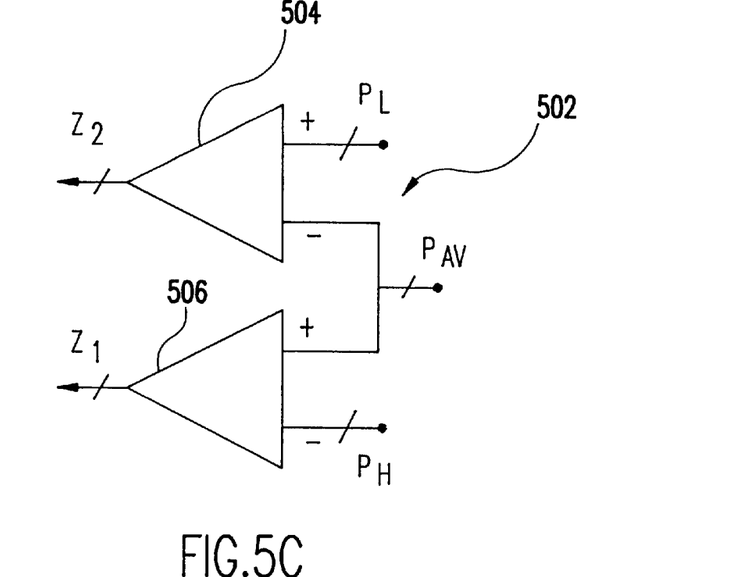
FIGS. 5c and 5d depict the comparators used in the embodiment of the present invention and their operational states, respectively.
Figure 5D:
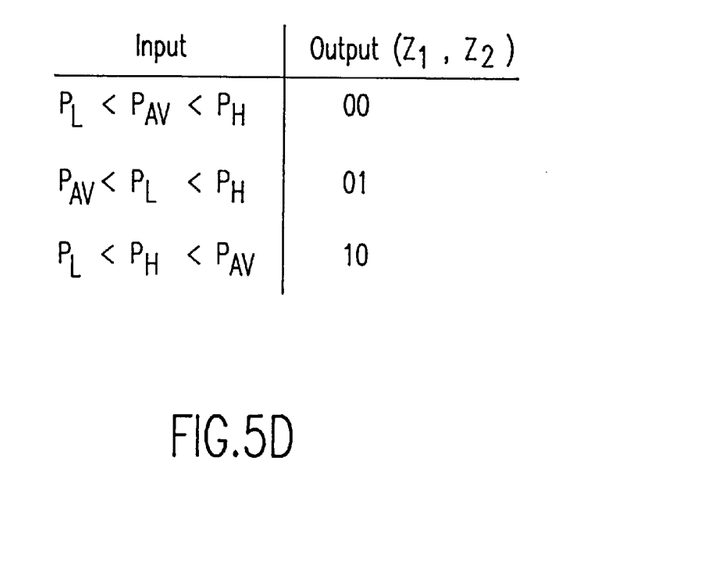

FIG. 5a depicts a comparator 500. FIG. 5b depicts the operational states of the comparator 500. FIG. 5c depicts a range detector or window comparator 502 formed from two comparators 504 and 506 that are connected in the same manner as the comparators 405 and 412 of FIG. 4. FIG. 5d explains the operational states of the window comparator 502.

Figure 8:
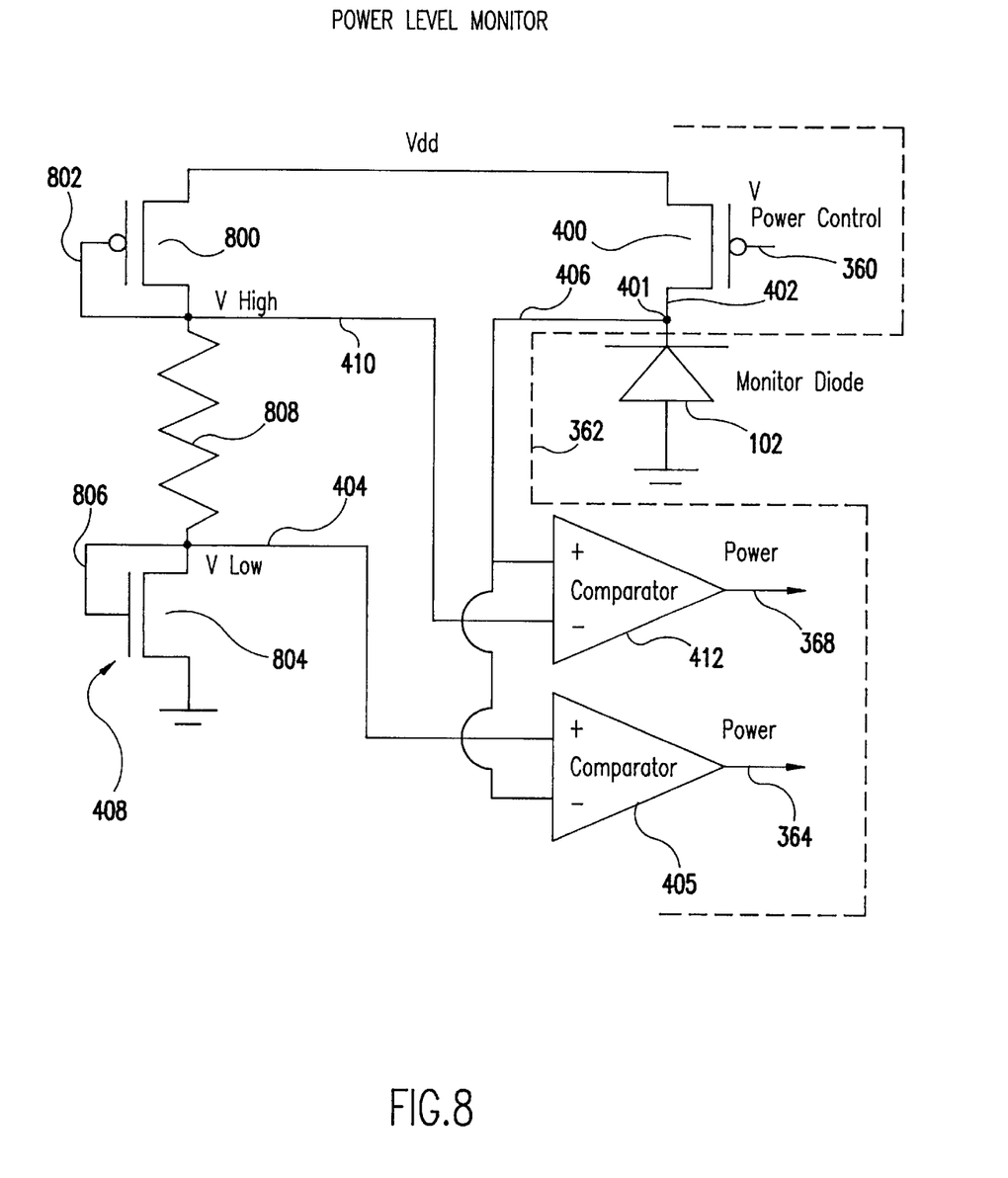
FIG. 8 depicts the power level monitor circuitry of the present invention in more detail.

FIG. 8 depicts the power level monitor 362 in yet greater detail. Items that are the same as those in FIGS. 4 and 3 have been given the same number. A PMOS transistor 800 is connected in a diode configuration, i.e., its gate is connected to its drain via a signal line 802. The source of the PMOS transistor 800 is connected to Vdd while the drain is connected to the resistor 808. A drain of an NMOS transistor 804 is connected to the other side of the resistor 808. The NMOS transistor 804 is also connected in a diode configuration, i.e., its drain is connected to its gate via a signal line 806; its source is connected to ground.

If the photodiode 102 receives a large number of photons from the laser diode 300, it will generate a larger current than if it receives a small number of photons. The larger current through the transistor 400 will produce a lower voltage at node 401 than will the smaller current. Hence, the high power reference value 403 of FIG. 4 corresponds to the voltage $V_{low}$ on the drain of the transistor 804. Also, the low power reference value 408 corresponds to the voltage $V_{high}$ on the drain of the transistor 800.

The operation of the present embodiments will now be discussed.

The current supplied to the laser diode 300 is a summation of a bias current Ibias and a modulation current Imod. A digital representation of the bias current Ibias is stored in the bias register 310 and is converted to an analog bias current Ibias by the threshold DAC 326. Similarly, a digital representation of the modulation current Imod is stored in the modulation register 312 and is converted to an analog modulation current Ibias by the modulation DAC 332.

Figure 7:
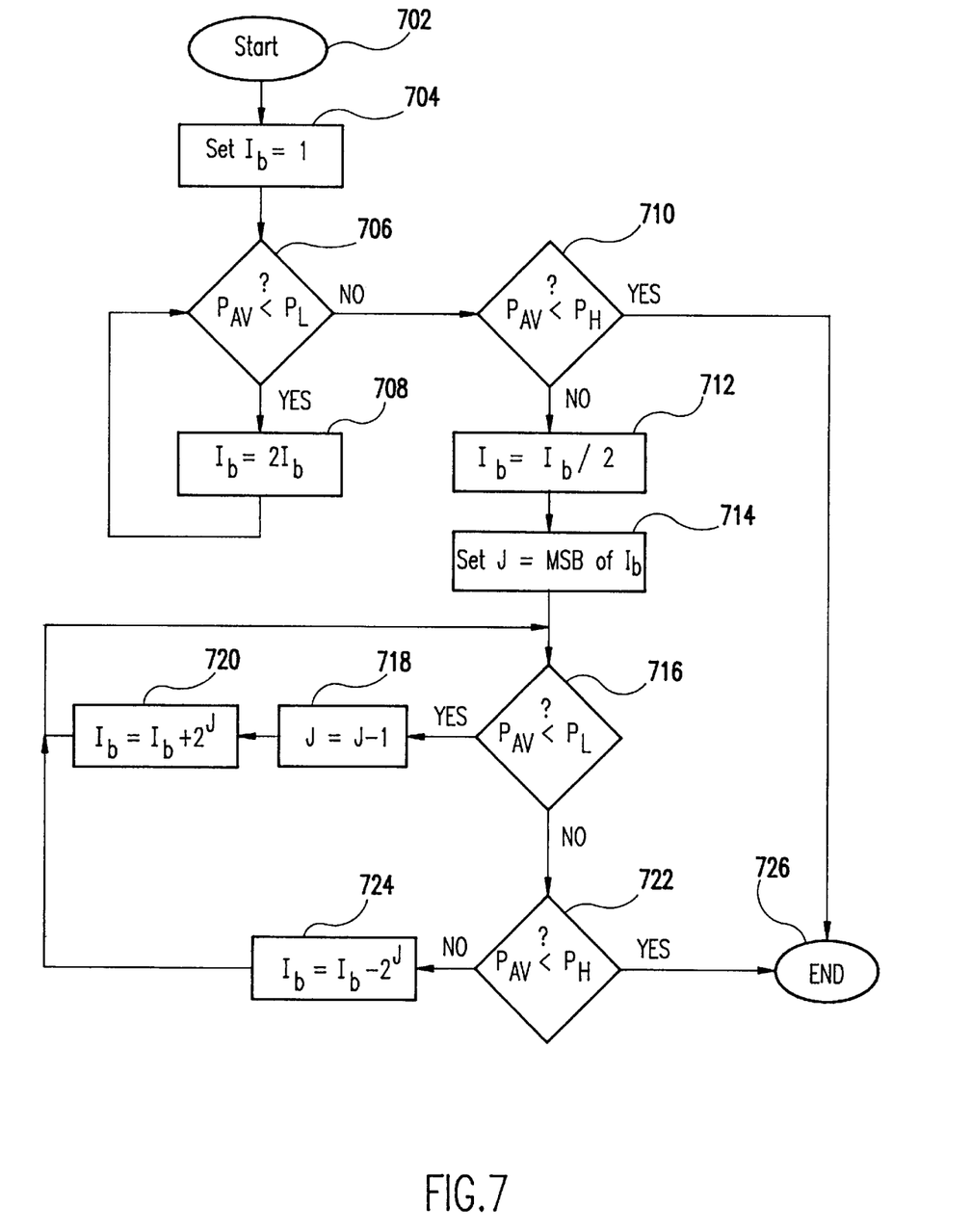
FIG. 7 depicts the routine used to initially set the bias current of the embodiment of the present invention.

Referring to FIG. 9, when power is turned on, the startup search logic 900 carries out the routine of FIG. 7 to set an initial value of Ibias in the bias register 310. Control is then transferred to the incremental adjustment logic 902, which continually updates the value set in the bias register 902. The modulation logic 904 sets the value in the modulation register 312 based in part upon the value bias register 310 according to an equation to be discussed below.

The light output of the laser diode 300 is monitored with the photo diode 302. The signal from the photo diode 302 is input to the power level monitor 362. As alluded to above, the comparators 405 and 412 combine to form a window comparator. The operation of a window comparator will be explained with reference to FIGS. 5a–5d.

For the single comparator of FIG. 5a, two input conditions are considered to be possible. The first is when the plus input is greater than the minus input, which causes and output Z=1. If the plus input is less than the minus input, then Z=0.

The comparators 504 and 506 of FIG. 5b correspond to the comparators 405 and 412 of FIG. 4, respectively. The high power reference value 403 corresponds to the $P_H$ value on the minus input of the comparator 506 while the low power reference value 408 corresponds to the $P_L$ value on the plus input of the comparator 504. The voltage at the node 401 corresponds to the average power Pav value on the minus input of the comparator 504 and the plus input of the comparator 506, respectively.

Three voltage relationships are considered to be possibilities for the window comparator 502, and these are depicted in FIG. 5D. If Pav falls within the range between $P_L$ and $P_H$, then the outputs of both of the comparators 504 and 506 are zeroes, i.e., Z1Z2=00. If Pav<$P_L$, then Z1Z2=01. If $P_H$<Pav, then Z1Z2=10. It is theoretically possible for Pav to equal either $P_L$ or $P_H$, but as a practical matter it is extremely unlikely that this would coincide with the time at which the outputs of the comparators are sampled. If this did occur, then the output of the particular comparator would be spurious. More importantly, at the next sampling, the value of Pav would differ from the corresponding reference value, and the operation of the given comparator again would be accurate.

A great advantage of the power controller 306 of the present invention is the digital control embodied by the logic 308. The digital logic 308 permits the bias current Ibias, the modulation current Imod, the clock control parameter, and the power control parameter to be set as M bit binary numbers in the registers 310, 312, 314 and 316, respectively.

As discussed in terms of FIG. 2, the total current that is supplied to the laser diode is a square wave having a positive offset. The power controller 306 of the present invention forms the square wave by selectively switching the modulation current Imod alternatively between the laser diode 100 and the dummy load 344 so that the laser diode 100 sees a square waveform though the modulation dac 332 supplies a continuous current Imod. The switching corresponds to the periodicity of the square wave. The frequency for the square wave is controlled by the digital representation of the clock control parameter stored in the clock register 314. The external commands sent over the lines 322 to the command receiver 318 can include a command to set the value in the register 314.

Alternatively, data transmission circuitry could be added in addition to, or as a replacement for, the clock register 314, the clock control DAC 352 and the clock generator 349. This data transmission circuitry would pass data directly to the differential modulator 335 so that the data could be transmitted by the laser diode 300.

The digital representation of the clock control parameter is converted to an analog signal by the clock control dac 352, and is then operated upon by the variable rate ring oscillator 348 and subsequently buffered by the clock buffer 345. In more detail, the clock buffer 345 turns the PMOS transistors 414 and 416 on and off oppositely (so that they are out of phase) by way of the signal lines 338 and 340 connected to the gates thereof, respectively.

The desired value of the modulation current Imod is set in the modulation register 312 and then converted from a digital representation to an analog control signal by the modulation dac 332. The desired modulation current value that is set in the register 312 is determined from the equation Imod=k1+k2*$I_{bias}$ where k1 and k2 are constants determined at the time of manufacture. It is to be observed that this equation is the first two terms of a power series. It has been determined by the Inventors that using only the first two terms of the power series is sufficient to calculate Imod with reasonable accuracy. More terms can be incorporated into the equation, although this imposes a penalty of increasing the complexity of the control logic.

The comparators 405 and 412 receive the analog power signal from the power monitor diode 102 and produce two outputs, power high and power low, which correspond to the outputs Z1 and Z2, respectively, of FIGS. 5C and 5D. Depending upon the logic chosen to implement the invention, these signals can be viewed as two discrete signals or as the individual bits of a 2-bit binary number.

Figure 6:
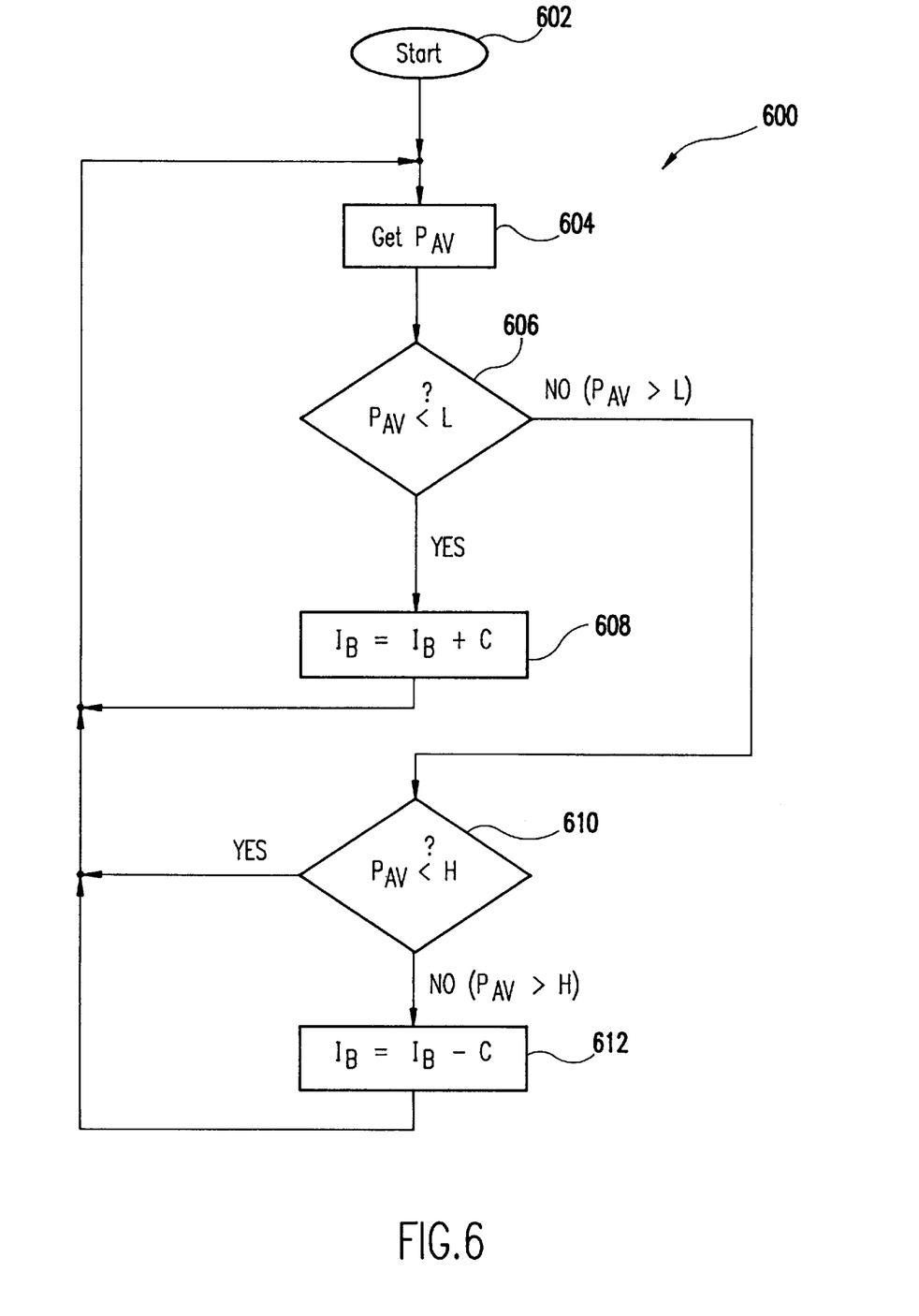
FIG. 6 depicts the control routine implemented by the embodiment of the present application after initialization.

FIG. 6 depicts the operation of the digital control logic after initialization, i.e., during normal operation. The flow in the chart depicted in FIG. 6 starts at step 602 and proceeds to step 604, where the average power value is obtained from the power monitor diode 302. It is noted that the signal at node 401 from the power monitor diode 102 corresponds to the average power output by the laser diode 100 because the power monitor diode is preferably a relatively large, slow responding photodiode whose output is not amplified.

At decision step 606 of FIG. 6, it is determined whether Pav is less than $P_L$, the low power reference value. If so, then flow proceeds to step 608, where the bias current Ibias is incremented by a predetermined constant C, where C preferably equals 1. Then flow proceeds back to step 604. However, if Pav is determined to be greater than $P_L$, then flow proceeds to the decision step 610.

At decision step 610 of FIG. 6, it is determined whether Pav is less than $P_H$, the high power reference value. If so, then Pav is within the desired range of values and no adjustment needs to be made to the digital representation of the desired value for the bias current, Ibias, that is stored in the bias register 310. However, if Pav is greater than $P_H$, then flow proceeds to step 612 where the bias current is decremented by the predetermined constant C and then flow proceeds back to step 604 where the average power is again considered.

The control algorithm depicted in FIG. 6 could be used at initialization as well as during normal operation, but the Inventors have found that this results in a slow initialization. A faster initialization routine is depicted in FIG. 7.

Flow in FIG. 7 begins at step 702 and proceeds to step 704, where the initial value of Ibias is set equal to 1. Flow then proceeds to decision step 706.

In the decision step 706 of FIG. 7, it is determined whether Pav<$P_L$, where $P_L$ corresponds to the low power reference value 408. If so, then flow proceeds to step 708 where the value of Ibias is multiplied by two. This is achieved by performing a left shift operation on the contents of the register 310. Flow proceeds from step 708 back to the decision step 706. If Pav>$P_L$, then flow proceeds to the decision step 710.

In the decision step 710 of FIG. 7, it is determined whether Pav<$P_H$, where $P_H$ corresponds to the high power reference value 403. If so, then Pav falls within the desired range of values between $P_L$ and $P_H$ and flow proceeds to the end point 726. However, if Pav>$P_H$, then flow proceeds to step 712 where Ibias is divided by two. This corresponds to a right shift of the contents of the register 310. Flow then proceeds to step 714, where the value of the variable J is set as the index of the most significant non-zero bit value of the digital representation of Ibias. Flow then proceeds to the decision step 716.

In the decision step 716 of FIG. 7, it is determined whether Pav<$P_L$. If Pav<$P_L$, then flow proceeds to step 718 where the value of J is decremented by 1 and then proceeds to step 720 where the new value of Ibias is set equal to the old value of Ibias plus $2^J$. Flow then proceeds back to the decision step 716. If Pav>$P_L$, then flow proceeds to the decision step 722.

In the decision step 722 of FIG. 7, it is determined whether Pav<$P_H$. If so, then flow proceeds to ending point 726. If Pav>$P_H$, the flow proceeds to step 724, where the new value of Ibias is set equal to the old value of Ibias minus $2^J$. From the step 724, flow proceeds back to the decision step 716.

The initialization routine of FIG. 7 can be described as a logarithmic search that rapidly converges the value of the bias current Ibias to a value that produces a light output that falls within the desired range of values of between $P_H$ and $P_L$. It is to be observed that this initialization routine could also be used during normal operation in place of the routine depicted in FIG. 6, but that is not preferable. The Inventors have found that, for normal operation, the routine of FIG. 7 produces large disturbances in the bias current. For example, if Pav<$P_L$, then this routine doubles the bias current Ibias, which is large change at normal operating levels.

The external commands sent over the lines 322 to the command receiver 318 can also include a command to set the value in the monitor register 316. The digital representation of the monitor control parameter in the register 316 is used to control the voltage applied to the gate of the PMOS transistor 400, which acts as an active resistor. During the lifetime of the power controller 362, it may become necessary to change the value in the register 316 because of a need to change the responsiveness of the power level monitor 362. The determination that such a change is necessary would be made using standard calibration technology available with a standard optical disk drive.

It is to be observed that an advantage of the power level monitor 362 is that the analog voltage on the node 401 is inputted directly to the minus and plus terminals of the comparators 405 and 412, respectively, via the signal line 406. This greatly simplifies the circuitry of the power controller 306 because it eliminates the need for analog to digital converters.

Another advantage of the invention to be observed is that the quasi-decision based control, made possible by the window comparator formed from the comparators 405 and 412, results in a much less complex control logic the is required by the digitally implemented linear, e.g., proportional-integral (PI), approaches used by typical laser diode power controllers.

Yet another advantage of the invention to be observed is the provision of a continuous modulation current that is selectively switched between the laser diode and the dummy load (so as to form the current driving the laser diode into a square waveform) without introducing the noise into the power supply that would otherwise be induced by large changes in the amount of current being drawn (therefrom in proportion to the large changes in modulation current).

To restate an advantage of the invention, the power controller 306 is implemented entirely in CMOS transistors, despite the prevailing thinking in the prior art that this could never be commercially viable because of the harsh penalties in chip surface area consumption incurred due to forming the high current-sourcing circuitry out of CMOS transistors.

In practice, the four high current-sourcing devices of the power controller 306, namely the output transistor (not depicted) in the threshold DAC 326, the output transistor (not depicted) in the modulation DAC 332), and the transistors 414 and 416 in the differential modulator 335, consume approximately 50% of the surface area of the chip on which the power controller 306 is integrated. As a further practical consideration, each of these large transistors is formed from approximately 100 smaller transistors connected in parallel. Together, the threshold DAC 326 and the modulation DAC 332 can supply up to approximately 300 milliamperes of current to the laser diode using 0.5 micron CMOS technology (depending upon the impedance of the laser diode). This is an astonishingly large amount of current to be obtained from 0.5 micron CMOS technology.

Because the quasi-decision-based control routines of the power controller 306 are so much simpler than the linear, e.g., proportional-integral (PI), control routines of the typical laser diode power controllers, the extremely large areas consumed by the high current-sourcing circuitry can be accommodated on a single chip, and that single chip is of moderate size. Fabricating the power controller 306 as an integrated circuit using only CMOS technology results in enormous reductions in the costs in manufacture.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed:

1. A device for controlling a power output of a laser diode, the device comprising:

a power indicator circuit for providing a first signal indicative of a power level being output by said laser diode;

a digital bias current setting circuit for determining a digital representation of a bias current;

a digital modulation current setting circuit for determining a digital representation of a modulation current;

a digitally-controlled bias current source for providing an analog bias current to said laser diode based upon said digital representation of said bias current; and a digitally-controlled modulation current source for providing an analog modulation current to said laser diode based upon said digital representation of said modulation current;

said digital bias current setting circuit, said digital modulation current setting circuit, said digitally-controlled bias current source and said digitally-controlled modulation current source being formed of CMOS transistors.

2. The device of claim 1, wherein at least some of the CMOS transistors is said digitally-controlled bias current source circuit and said digitally-controlled modulation current source circuit operate in an analog mode.

3. The device of claim 1, wherein said digital bias current setting circuit includes a register for storing said digital representation of said bias current, and said digitally-controlled bias current source includes a digital to analog converter to convert said digital representation of said bias current adjustment signal into said analog bias current.

4. The device of claim 1, wherein said digital modulation current setting circuit includes a register for storing said digital representation of said modulation current, and said digitally-controlled modulation current source includes a digital to analog converter to convert said digital representation of said modulation current into said analog modulation current.

5. The device of claim 1, wherein said power indicator circuit includes:
a photodiode, an output of which is said first signal;
a transistor, a source of which is connected to Vdd and a drain of which is connected to said photodiode, said transistor being one of an NMOS and a PMOS transistor;
a register for storing a digital representation of a monitor control parameter; and
a digital to analog converter, connected between said register and said transistor, to convert said digital representation of said monitor control parameter into an analog gate voltage.

6. The device of claim 5, wherein said first signal represents an average power level generated by said laser diode.

7. The device of claim 6, further comprising:
a first transistor, a source of which receives said modulation current and a drain of which is connected to said laser diode;
a second transistor, a source of which receives said modulation current and a drain of which is connected to ground;
a clock generator for generating a first clocking signal connected to a gate of said first transistor and a second clock signal connected to a gate of said second transistor;
a register for storing a digital representation of a clock control signal to be applied to said clock generator; and
a digital to analog converter, connected between said register and said clock generator, to convert said digital representation of said clock control signal into an analog clock control signal.

8. The device of claim 7, wherein said clock generator includes:
a variable rate ring oscillator connected to receive said analog clock control signal; and
a clock buffer, responsive to said variable rate ring oscillator, for providing said first and second clocking signals.

9. A device for controlling a power output of a laser diode, the device comprising:
a power indicator circuit for providing a first signal indicative of a power level being output by said laser diode;
a range detector for determining if said power level of said laser diode is within a desired range of values based upon said first signal and for providing a digital second signal indicative thereof;
a digital bias current setting circuit for determining a digital representation of a bias current;
a digital modulation current setting circuit for determining a digital representation of a modulation current;
at least one of said digital representation of said bias current and said digital representation of said modulation current being determined in part according to said digital second signal;
a digitally-controlled bias current source for providing an analog bias current to said laser diode based upon said digital representation of said bias current; and
a digitally-controlled modulation current source for providing an analog modulation current to said laser diode based upon said digital representation of said modulation current.

10. The device of claim 9, wherein said digital bias current setting circuit, said modulation current setting circuit, said digitally-controlled bias current source and said digitally-controlled modulation current source are formed of CMOS transistors.

11. The device of claim 10, wherein said range detector also is formed of CMOS transistors.

12. The device of claim 9, wherein said power indicator circuit includes a photodiode an output of which is said first signal, said first signal representing an average power level generated by said laser diode.

13. The device of claim 9, wherein said range detector includes a first comparator for comparing a predetermined upper bound against said first signal to produce a first comparison result and a second comparator for comparing a predetermined lower bound against said first signal to produce a second comparison result, said second signal representing said first and second comparison result.

14. The device of claim 13, wherein said digital bias current setting circuit is operable to decrease said bias current by a first predetermined amount if said first signal is greater than said predetermined upper bound and is operable to increase said bias current by a second predetermined amount if said first signal is not greater than said predetermined lower bound.

15. The device of claim 14, wherein said digital bias current setting circuit is operable to set a new bias current Ib(n+1) to be Ib(n+1)=2*Ib(n) if said first signal is less than said predetermined lower bound, and is operable to set Ib(n+1) to be Ib(n+1)=Ib(n)/2, to set a value J corresponding to a number of bits necessary to represent Ib(n+1), to decrement J, and to selectively add at least one of $2^J$, $2^{J-1}$, $2^{J-2}, \ldots 2^2, 2^1, 2^0$ to Ib(n+1) if said first signal is greater than said predetermined upper bound.

16. The device of claim 9, wherein said digital modulation current setting circuit is operable to provide said modulation current Im to be Im=k1+k2*Ib, where Ib is said bias current, and k1 and k2 are constants.

17. The device of claim 9, further comprising:
a dummy load; and
a switching circuit, connected between said modulation driver circuit and said laser diode, for selectively switching said modulation current to one of said laser diode and said dummy load so that said modulation current is continually supplied to one of said laser diode and said dummy load and so reduce sympathetic noise in other circuitry.

18. The device of claim 9, wherein said switching circuit includes:
a first transistor, a source of which receives said modulation current and a drain of which is connected to said laser diode;

a second transistor, a source of which receives said modulation current and a drain of which is connected to ground;

a clock generator for generating a first clocking signal connected to a gate of said first transistor and a second clock signal connected to a gate of said second transistor;

a register for storing a digital representation of a clock control signal to be applied to said clock generator; and a digital to analog converter, connected between said register and said clock generator, to convert said digital representation of said clock control signal into an analog clock control signal.

19. The device of claim 18, wherein said clock generator includes:

a variable rate ring oscillator connected to receive said analog clock control signal; and a clock buffer, responsive to said variable rate ring oscillator, for providing said first and second clocking signals.

20. The device of claim 9, wherein said digital bias setting circuit includes a register for storing said digital representation of said bias current, and said digitally-controlled bias current source includes a digital to analog converter to convert said digital representation of said bias current into said analog bias current.

21. The device of claim 9, wherein said digital modulation current setting includes a register for storing said digital representation of said modulation current, and said digitally-controlled modulation current source includes a digital to analog converter to convert said digital representation of said modulation current into said analog modulation current.

22. The device of claim 9, wherein said power indicator circuit includes:

a photodiode, an output of which is said first signal;

a transistor, a source of which is connected to Vdd and a drain of which is connected to said photodiode, said transistor being one of an NMOS and a PMOS transistor;

a register for storing a digital representation of a monitor control parameter; and a digital to analog converter, connected between said register and said transistor, to convert said digital representation of said monitor control parameter into an analog gate voltage.

23. The device of claim 9, wherein said digital representation of said bias current is determined in part according to said digital second signal and said digital representation of said modulation current is determined according to said digital representation of said bias current.

24. A method for controlling a power output of a laser diode, the device comprising:

providing a first signal indicative of a power level being output by said laser diode;

determining if said power level of said laser diode is within a desired range of values based upon said first signal and for providing a digital second signal indicative thereof;

determining a digital representation of a bias current;

determining a digital representation of a modulation current;

at least one of said digital representation of said bias current and said digital representation of said modulation current being determined in part according to said digital second signal;

providing an analog bias current to said laser diode based upon said digital representation of said bias current; and providing an analog modulation current to said laser diode based upon said digital representation of said modulation current.

25. The method of claim 24, wherein said first signal represents an average power level generated by said laser diode.

26. The method of claim 24, wherein said step of determining if said power level of said laser diode is within a desired range of values includes the steps of:

comparing a predetermined upper bound against said first signal to produce a first comparison result; and comparing a predetermined lower bound against said first signal to produce a second comparison result;

wherein said second signal represents said first and second comparison results.

27. The method of claim 24, wherein said step of digitally determining a bias current includes the steps of:

decreasing said bias current by a first predetermined amount if said first signal is greater than said predetermined upper bound; and increasing said bias current by a second predetermined amount if said first signal is not greater than said predetermined lower bound.

28. The method of claim 27, wherein said step of increasing said bias current sets a new bias current Ib(n+1) to be Ib(n+1)=2*Ib(n) if said first signal is less than said predetermined lower bound and, if said first signal is greater than said predetermined upper bound, then sets Ib(n+1) to be Ib(n+1)=Ib(n)/2, sets a value J corresponding to a number of bits necessary to represent Ib(n+1), decrements J, and selectively adds at least one of $2^J, 2^{J-1}, 2^{J-2}, \ldots 2^2, 2^1, 2^0$ to Ib(n+1).

29. The method of claim 24, wherein said step of digitally determining a modulation current sets Im to be Im=k1+k2*Ib, where Ib is said bias current, and k1 and k2 are constants.

30. The method of claim 24, further comprising the step of:

providing a dummy load; and selectively switching said modulation current to one of said laser diode and said dummy load so that said modulation current is continually supplied to one of said laser diode and said dummy load and so reduce sympathetic noise in other circuitry.

31. The method of claim 24, wherein said digital representation of said bias current is determined in part according to said digital second signal and said digital representation of said modulation current is determined according to said digital representation of said bias current.

32. A device for controlling a power output of a laser diode, the device comprising:

a power indicator circuit for providing a first signal indicative of a power level being output by said laser diode;

a digital bias current setting circuit for determining a digital representation of a bias current;

a digital modulation current setting circuit for determining a digital representation of a modulation current;

a digitally-controlled bias current source for providing an analog bias current to said laser diode based upon said digital representation of said bias current; and a digitally-controlled modulation current source for providing an analog modulation current to said laser diode based upon said digital representation of said modulation current;

a dummy load; and a switching circuit for selectively switching said analog modulation current to one of said laser diode and said dummy load so that said analog modulation current is continually supplied to one of said laser diode and said dummy load and so that sympathetic noise in other circuitry is reduced.

33. A method for controlling a power output of a laser diode, the method comprising the steps of:

providing a first signal indicative of a power level being output by said laser diode;

determining a digital representation of a bias current;

determining a digital representation of a modulation current;

providing an analog bias current to said laser diode based upon said digital representation of said bias current; and providing an analog modulation current to said laser diode based upon said digital representation of said modulation current;

providing a dummy load; and selectively providing said analog modulation current to one of said laser diode and said dummy load so that said analog modulation current is continually supplied to one of said laser diode and said dummy load and so that sympathetic noise in other circuitry is reduced.

* * * * *